United States Patent [19]

Parlour

[11] Patent Number: 5,867,396
[45] Date of Patent: Feb. 2, 1999

[54] METHOD AND APPARATUS FOR MAKING INCREMENTAL CHANGES TO AN INTEGRATED CIRCUIT DESIGN

[75] Inventor: David B. Parlour, Pittsburgh, Pa.

[73] Assignee: Xilinx, Inc., San Jose, Calif.

[21] Appl. No.: 523,070

[22] Filed: Aug. 31, 1995

[51] Int. Cl.$^6$ .................................................. G06F 17/50
[52] U.S. Cl. .......................................... 364/489; 364/488
[58] Field of Search .................................... 364/488, 489, 364/490, 578

[56] References Cited

U.S. PATENT DOCUMENTS

| | | | |
|---|---|---|---|
| 4,612,618 | 9/1986 | Pryor et al. ............................. | 364/490 |
| 4,703,435 | 10/1987 | Darringer et al. ...................... | 364/489 |
| 4,882,690 | 11/1989 | Shinsha et al. ........................ | 364/490 |
| 5,243,538 | 9/1993 | Okuzawa et al. ...................... | 364/489 |
| 5,249,133 | 9/1993 | Batra ...................................... | 364/489 |
| 5,278,769 | 1/1994 | Bair et al. .............................. | 364/490 |
| 5,331,568 | 7/1994 | Pixley .................................... | 364/489 |
| 5,436,849 | 7/1995 | Drumm ................................... | 364/490 |
| 5,463,561 | 10/1995 | Razdan .................................. | 364/489 |
| 5,544,066 | 8/1996 | Rostoker et al. ....................... | 364/489 |
| 5,572,436 | 11/1996 | Dangelo et al. ........................ | 364/489 |

OTHER PUBLICATIONS

Rick L. Spickelmier and A. Richard Newton, "WOMBAT: A New Netlist Comparsion Program", IEEE International Conference on Computer Aided Designer, 1983, pp. 170–171.

Carl Eberling and Ofer Zajicek, "Validating VLSI Circuit Layout by Wirelist Comparison", IEEE International Conference on Computer Aided Design, 1983, pp. 172–173.

"Hcompare: A Hierarchical Netlist Comparison Program" by P. Batra et al, 29th ACM/IEEE Design Automation Conference, 1992, pp. 299–304.

"Fast Incremental Circuit Analysis Using Extracted Hierarchy" by D.L. Beatty et al, 25th ACM/IEEE Design Automation Conf., 1988, pp. 495–500.

"DAGON: Technology Binding and Local Optimization by DAG Matching" by K. Keutzer, 24th ACM/EEE Design Automation Conference, 1987, pp. 341–347.

"Automatic Synthesis and Technology Mapping of Combinational Logic" by R. A. Bergamaschi, IEEE 1988, pp. 466–469.

"MIS: A Multiple–Level Logic Optimization System" by R.K. Brayton et al, IEEE Trans. on Computer–Aided Design, V. CAD–6, No. 6, Nov. 1987, pp. 1062–1081.

"Technology Mapping of Digital Circuits" by G. De Micheli, IEEE 1991, pp. 580–586.

*Primary Examiner*—Vincent N. Trans
*Attorney, Agent, or Firm*—Edel M. Young; Michael R. Casey

[57] ABSTRACT

An incremental circuit design methodology using logic synthesis where comparisons are made between netlists corresponding to two separate versions of a design to determine similarities between the two. The similarities are then used to ensure the same physical implementation for the unchanged portion of the design. Therefore, information from the physical implementation of the previous design may be used in implementing the later design.

36 Claims, 3 Drawing Sheets

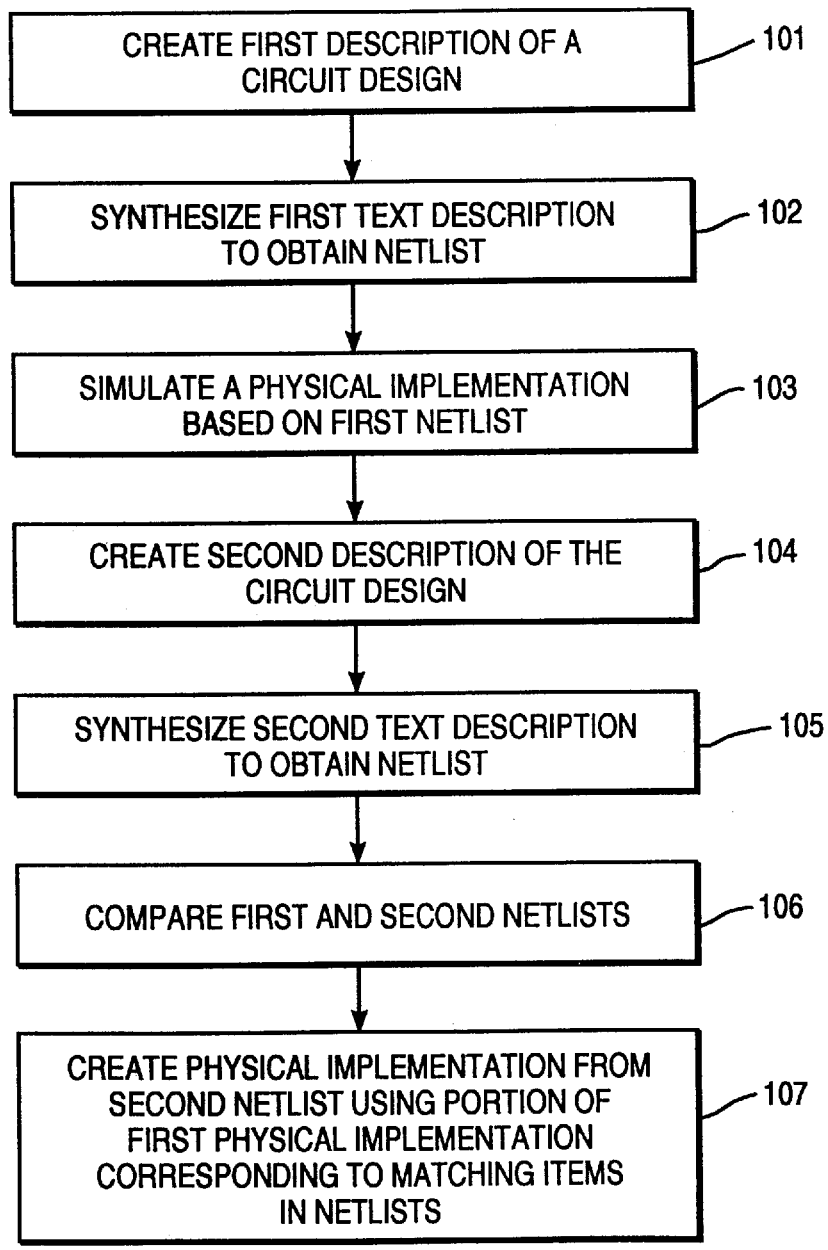
FIG_1

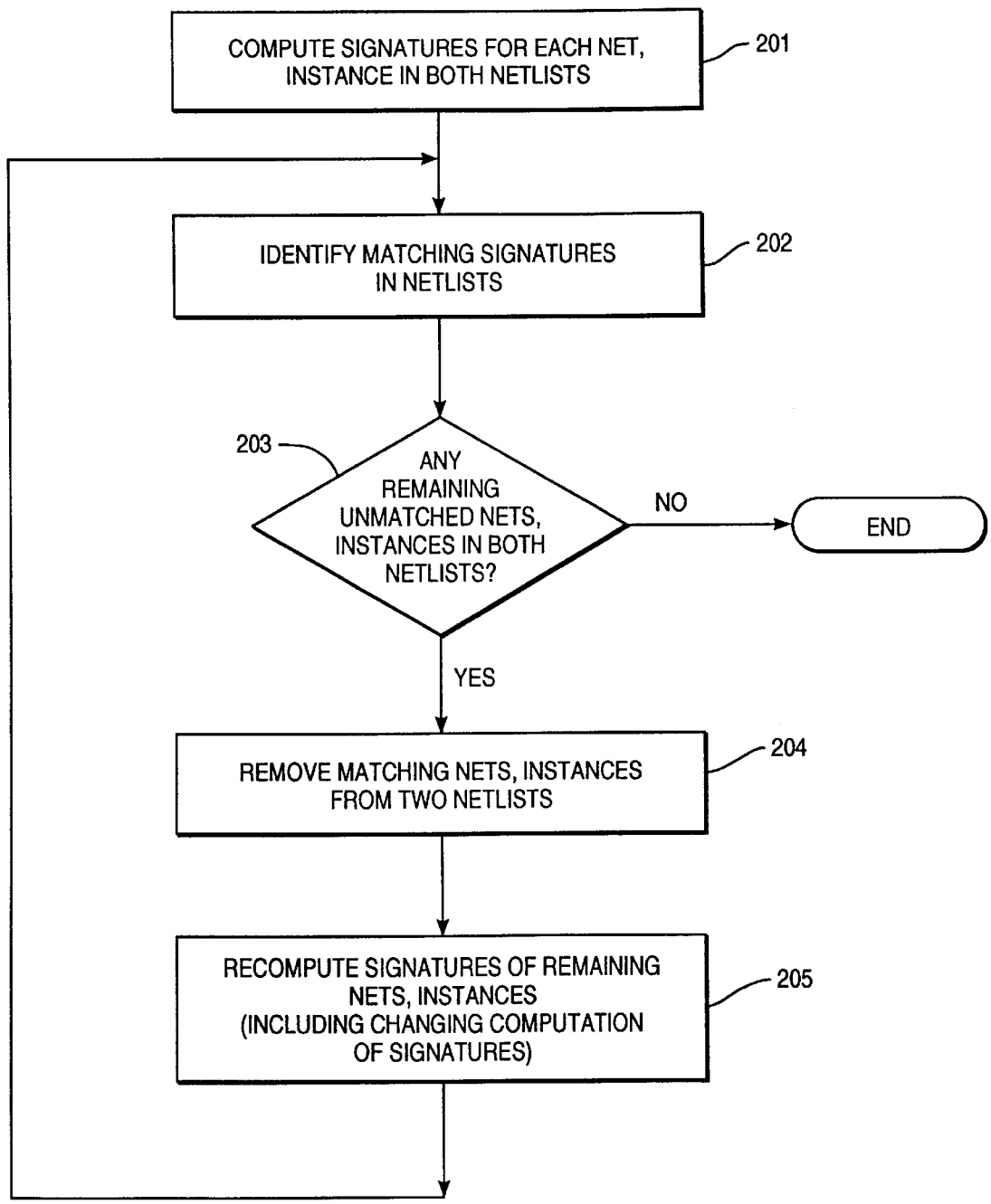
FIG_2

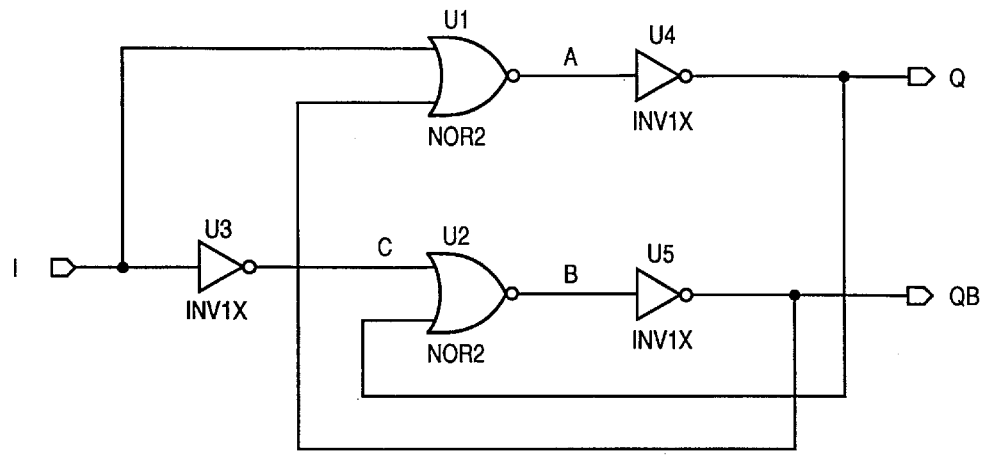
FIG_3
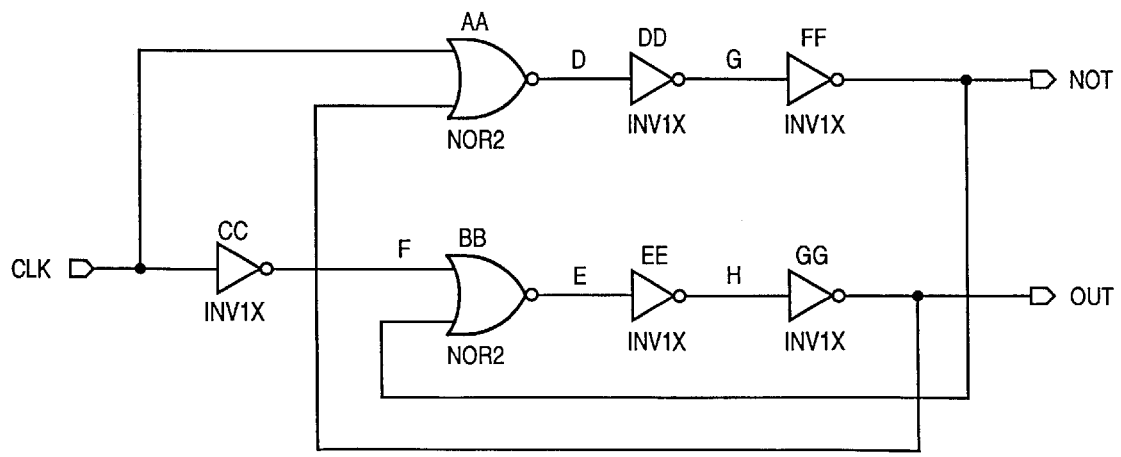
FIG_4

METHOD AND APPARATUS FOR MAKING INCREMENTAL CHANGES TO AN INTEGRATED CIRCUIT DESIGN

FIELD OF THE INVENTION

The present invention relates to the field of circuit design, such as in programmable integrated circuit devices that are configurable to implement designs; more particularly, the present invention relates to comparing netlists generated in different implementation cycles and constraining the implementation of a later design based on similarities between the two netlists determined as a result of the comparison process.

BACKGROUND OF THE INVENTION

The term "net" as used herein refers to a conductive region connecting components of a user's circuit design. For example, one net may connect the output terminal of an AND gate to the input terminal of another AND gate and to the input terminal of a flip flop. An AND gate is one component type. A flip flop is another component type. An "instance" is a single occurrence of a component type. A "netlist" is a list of all the nets which connect the component instances of a user's design and the component instances connected by each net.

Field programmable gate arrays (FPGAs) may be programmed to implement one of many different integrated circuit (IC) designs. Typically, these designs are provided by a customer in the form of design and timing constraints. Using the design and timing constraints, code is created that, when run, controls the programming of the FPGA.

During this process, a place and route operation is performed to configure an FPGA to a circuit that implements the customer design. If it is determined that after a place and route operation is performed a change to the design is required, both the design and the place and route processes are repeated from the beginning. Generally, it is desirable to avoid having to repeat the entire place and route process from the beginning because it can be very time consuming, both in man hours and system time.

One solution to avoid repeating the entire place and route process is to only re-implement the parts of the design that changed from the previous place and route cycle. Although this may be fairly straight forward when using schematics (because changes to a schematic cause very little change in a netlist), it is more difficult when the design has been generated through the use of logic synthesis and high-level languages.

In synthesis, user-entered design information consists of functional descriptions written in typically either Verilog or VHDL, and accompanying implementation scripts which document side information, such as timing constraints and design-tool specific commands (e.g., effort levels, mapping strategies, library selection, etc.). Therefore, when using synthesis, a user is not working with the primitives that eventually undergo placement and routing. Instead, a user is working in a high-level language which is translated to low-level primitives by a synthesizer. The low-level implementation of a design is not under the direct control of the user and contains nets and architectural primitives which cannot be easily related back to the original high-level description.

The typical synthesis design flow comprises initially creating a language-based functional design and imposing timing constraints on the design. Then, this high-level design is synthesized into architectural primitives and a netlist is generated (and possibly feed-forward timing information). Next, physical implementation occurs in the FPGA-specific design system based on the netlist. Following the physical implementation, back-annotation of the actual performance of the resulting implementation occurs. Thereafter, if necessary, an iteration of the mapping/implementation cycle may be performed to ensure that all the user-specified timing constraints are satisfied.

When portions of a design are to be changed, either as a result of a design change or to improve performance, the user in logic synthesis is only able to make changes to the high-level language description that produces the new design. When the changed high-level language description is resynthesised, the low-level netlist may be created with completely different instance names and net names, even when the "old" and "new" netlists are substantially the same from a functional point of view. In other words, even though the new design is functionally quite similar to the old design, the low-level netlists generated from both are radically different in terms of net names and instance names. Thus, the low-level netlists cannot easily be related to the original high-level design. Such a correspondence between the new and old topologies would be desirable in the synthesis environment in order to try to preserve as much of the layout, placement and routing as possible. This would permit an incremental design change to be made without changes to the implementation of unaffected areas. This would typically result in a faster physical implementation time.

Several authors have described methods for comparing netlists, a variant of a more general problem known as "graph isomorphism". Rick Spickelmier ("WOMBAT: A New Netlist Comparison Program", Rick L. Spickelmier and A. Richard Newton, IEEE International Conference on Computer Aided Designer, 1983, pp. 170–171) and Carl Ebeling ("Validating VLSI Circuit Layout by Wirelist Comparison", Carl Ebeling and Ofer Zajicek, IEEE International Conference on Computer Aided Design, 1983, pp. 172–173) both describe programs for determining whether or not integrated circuit (IC) layouts match their schematics by using a netlist verification process. When performing this determination, netlists were generated corresponding to the actual IC layout and corresponding to its schematic. The net and instance names of both netlists did not correspond to each other. After performing the comparison process, a determination of whether the IC matched the schematic resulted. Today, several commercial products are available for performing layout to schematic comparison.

The present invention provides for using a netlist comparison as part of an incremental design process. The results of the netlist comparison is actively used to control the implementation process, as opposed to solely providing a form of verification.

SUMMARY OF THE INVENTION

A method for performing circuit design is described. The present invention includes comparing a first netlist corresponding to a first implementation with a second netlist to determine common circuit structures (e.g., nets, instances, etc.). The present invention also includes creating a second physical implementation constrained to include a portion of the first implementation associated with the common circuit structures.

The present invention performs the netlist comparison process using signature analysis and topological information, such as, for instance, component type, pin type and connectivity. The use of signature analysis incorporates robustness in the presence of differences, allows for fast comparison, and results in an algorithm that has a roughly linear relationship between circuit complexity and computing time requirement. Furthermore, using signature analysis, the present invention is easy to tune or adapt for specific circumstances (e.g., design verification versus incremental design). Although signature analysis is used in one embodiment, other techniques may be used for comparing netlists.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1 is a flow chart of one embodiment of the circuit design process of the present invention.

FIG. 2 is a flow chart of one embodiment of the netlist comparison process of the present invention.

FIGS. 3 and 4 illustrate two versions of circuit designs representing an initial circuit design and a subsequent circuit design.

DETAILED DESCRIPTION OF THE PRESENT INVENTION

A method and apparatus for configuring a circuit design in a programmable integrated circuit (IC) device is described. In order to provide a thorough understanding of the present invention, specific details are set forth, such as instance and net names, signature types and definitions, etc. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

The present invention provides a process for designing a circuit by comparing new and old topologies created in a synthesis environment and preserving as much of the layout, placement and the routing of the old topology as possible when implementing the new topology. The process of the present invention includes performing a comparison between two separate topologies. The comparison is performed by comparing the low-level netlist of the older topology with the low-level netlist of the new topology. The results of the comparison include an identification of those portions of the old and new topology that are the same (i.e., that match). However, the comparison process of the present invention does not rely on similarities of names of nets or instances in the netlists being compared. Even without the use of a common naming convention in the two netlists, the present invention determines the differences between the two netlists so as to be able to extract as much of the topological similarity as possible between the two.

By determining topological similarities between the old design and the new design, the present invention is able to obtain information from the physical implementation of the old design for use in implementing the new design. The "match" information derived from the comparison process is used to generate constraints to control, or guide, the implementation process for the new topology. The extracted similarities may be used to guide the partitioning, placement or routing as desired. This eases integration of the guide system into an existing tool and also permits the user to perform additional floor-planning prior to implementation.

Thus, the present invention provides a technique which matches similar topologies or functionalities between two designs without regard to net and instance names, and uses the matching information to generate constraints for placement and routing tools. In this manner, the common portion the newer designs does not have to undergo placement and routing stage because the placement and routing performed for the older design may be used.

FIG. 1 illustrates one embodiment of the circuit design process of the present invention. The process depicted in FIG. 1 is a logic synthesis process that may be performed in hardware, software, or a combination of both. For instance, the present invention may be performed on a computer controlled circuit design system, such as are currently available. Also, software implementing all or a portion of the present invention (when running in a system) may be stored on disk (e.g., portable floppy disk).

Referring to FIG. 1, a designer creates a first text description of a circuit design (processing block 101). The first text description is in Verilog, VHDL, or another high-level language. Next, processing logic synthesizes the first text description to obtain a first netlist that is associated with a first schematic representation of the circuit (processing logic 102). Then processing logic simulates a first physical implementation of the circuit on a programmable logic device, such as a field programmable gate array (processing block 103). Note that the reference to "first" corresponds to any older topology. The simulation allows the logic and timing performance of the circuit to be observed.

Based on the performance observations, the designer or processing logic alters the first text description, thereby creating a second text description of the circuit design (processing block 104). The alteration may be performed to improve the logic and/or timing performance of the circuit (e.g., bring the performance of the circuit into predefined limits or requirements). This may not be required in all implementations, but is typically included in any incremental design process.

Once the second text description is created, processing logic synthesizes it to obtain a second netlist associated with a second schematic representation of the circuit (processing block 105).

Processing logic compares the first netlist to the second netlist to determine topological similarities between the first and second schematic representations (processing logic 106). The comparison process of the present invention is described in further detail below.

Once similarities has been identified, processing logic creates a second physical implementation of the circuit design on a programmable logic device which includes that portion of the first physical implementation having topological similarity to the second schematic representation of the circuit (processing logic 107). The generation of constraints for implementation of the circuit design is also described in more detail below.

Netlist Comparison by Signature Analysis

The present invention performs the netlist comparison process using signature analysis and topological information, such as, for instance, component type, pin type and connectivity. The use of signature analysis incorporates robustness in the presence of differences, allows for fast comparison, and results in an algorithm that has a roughly linear relationship between circuit complexity and computing time requirement. Furthermore, using signature analysis, the present invention is easy to tune or adapt for specific circumstances (e.g., design verification versus incremental design). Although signature analysis is used in one embodiment, other techniques may be used for comparing netlists.

Note that the present invention does not require any starting information such as correspondence points between the two netlists. If application-specific information about netlist correspondence is available, it may be used if desired. For instance, application-specific information such as the top-level port names of synthesized designs are generally user-assigned and thus, stable during incremental design.

FIG. 2 is a flow chart of one embodiment of the comparison process of the present invention. Referring to FIG. 2, the process begins with computing signatures for each net and instance in the two netlists being compared (processing block 201). In one embodiment, signatures are initially assigned, as opposed to computed, to nets and instances in the netlists. The signatures of the present invention are derived based on topological information (e.g., component type, pin type, connectivity, etc.), such that components which are identically connected or nets which have identical topology from each of the two netlists have the same signature and those components which are not the same have different signatures.

In one embodiment, the signatures for all components are based, initially, only on their component type, with all components (instances) of the same type having the same signature. Similarly, all nets are assigned the same signature initially. Each signature may comprise a random number. In this embodiment, each instance of the same type is assigned the same random number ($SI_0(inst)=f(type)$), and all nets are initially assigned a signature of 1 ($SN_0(net)=1$). Note that in one embodiment, processing logic assigns each pin type an associated random number, $f(pin)$, as its signature.

Once signatures have been computed for, or assigned to, all nets and instances in the two netlists, processing logic identifies matching signatures in the netlists (processing block 202). In one embodiment, two (or more) signatures are considered "matching" when they are identical. In alternate embodiments, signatures may be considered matching when a predetermined portion of each signature matches a corresponding portion of another signature. A record is maintained in system memory of the pairs of circuit structures that have matching signatures.

In one embodiment, the present invention identifies unique signatures of components in each of the two lists by inserting the components into a hash table. Conceptually, the hash table represents an array with the signature as the index into the array. Thus, the signatures are used to put the nets and instances into a hash table. If two signatures match, their nets or instances fall into the same hash table entry. Based on this fact, matches may be determined.

A match in a hash table entry for the purposes of identifying common structures in the netlists occurs when there is only one particular signature from the first netlist that matches only one signature from the second netlist. If ambiguity exists in the determination of whether a particular net or instance matches another net or instance, more than one component or net hashes to a hash table entry. If more than one signature in the first netlist matches one or more signatures in the second netlist, then more hashing is required to determine a unique match in subsequent passes. As matches are made, ambiguous hash table entries are less then more hashing is required to determine a unique match in subsequent passes. As matches are made, ambiguous hash table entries "spread out" (components which were formerly congregated at the same hash table entries are now dispersed to many other hash table entries), and more matches are made. If differences exist, items in one list will fall into the hash table locations without corresponding entries from the other list.

In one embodiment of the present invention, all nets are hashed and subsequently a determination is made as to whether any matches exist. It is only then that all the instances are hashed and corresponding matches are again searched. In this manner, all matches that exist between the two netlists may be identified. Note that the use of hash tables is well-known in the art.

Once all of the matches have been identified, processing logic tests whether there are remaining unmatched signatures in the two lists (processing logic 203). If not, then processing logic ends processing. If so, processing logic removes the matching nets and instances of the two netlists (processing block 204) and recomputes the signatures of the remaining nets and instances in the two lists (processing block 205).

In one embodiment, on successive passes, processing logic recomputes the signatures according to the following equations:

$$SI_{n+1}(\text{instance}) = SI_n(\text{instance}) + \text{sum over all instance's pins } (f(\text{type}) * f(\text{pin}) * SN_n(\text{pin's net}))$$

$$SN_{n+1}(\text{net}) = SN_n(\text{net}) + \text{sum over all net's pins } (f(\text{pin}) * SI_{n+1}(\text{pin's instance})).$$

Once signatures have been recomputed, processing continues at processing block 202.

The process of the present invention is iterative and may include numerous passes, during which time, the signatures evolve. The process iterates until no more matches can be found.

In one embodiment, modifications to the signatures can be made when no unique signatures match between the two lists. For instance, the information used to generate the signatures may be changed when recomputing the signatures.

The procedure for changing the computation of signatures includes resetting unmatched net and component hash values and attempting one of a number of strategies. For instance, the signature definitions may ignore unmatched instances when hashing nets, ignore unmatched nets when hashing instances, ignore input pins, ignore pin types (e.g., f(pin)=1), and/or ignore component types (e.g., f(type)=1). By ignoring pin type (input vs. output, clock vs. data, etc.) matches may occur around pins that are, for example, transposed. By ignoring component type, matches of wires may occur where assignment of component type has changed, yet the connections remain the same.

The processes of the present invention may use user-assigned port names to disambiguate connections to the outside world. For example, while all the bits of a memory are interchangeable, an attentive user might be disconcerted to find the ordering of bits in a data bus changing on successive design iterations. If the design has an internal structure that cannot be disambiguated, an arbitrary binding may be made.

An Exemplary Comparison Process

One implementation of the comparison process of the present invention is illustrated in pseudocode below. The routine compares two designs, referred to as design0 and design1:

```
/* Top-level Routine to Compare Two Designs
Implements a state machine controlling matching strategies based on the
outcome of successive passes. Strategies (in order of application) are:
    FULL_MATCH                    strictest hashing - use all information
    IGNORE_UNMATCHED_NETS         don't hash pins attached to unmatched nets
    IGNORE_UNMATCHED_INSTANCES    don't hash pins attached to unmatched insts
    IGNORE_INPUTS                 don't hash any input pins
    MATCH_ARBITRARY               perform full hash, but match IO instances by
                                  port name, or force matching of instances
                                  which are still ambiguous
*/
netlist_compare ( design0 , design1 ) {
    last_strategy = strategy = FULL_MATCH
    init_flag = 1 /* set to 1 to reset all instance, net signatures */
    do {
        /* do a hashing pass with the indicated strategy and return
           non-zero if unable to match any components or nets
        */
        stuck = do_pass( strategy ,design1 , init_flag )
        init_flag = 0
        switch( strategy ) {
            case FULL_MATCH /* basic strategy - stick with this until process gets stuck */
                if( stuck ) {
                    strategy = IGNORE_UNMATCHED_NETS
                    init_flag = 1
                    stuck = 0
                }
            /* on all the following strategies, stick with them until they produce no
               more matches. If they worked at least once, fall back to 'FULL_MATCH',
               otherwise advance to the next (increasingly desperate) strategy.
            */
            case IGNORE_UNMATCHED_NETS
                if( stuck ) {
                    if( last_strategy == FULL_MATCH ) {
                        strategy = IGNORE_UNMATCHED_INSTANCES
                        init_flag = 1
                    } else strategy = FULL_MATCH
                    stuck = 0
                }
            case IGNORE_UNMATCHED_INSTANCES
                if( stuck ) {
                    if( last_strategy == IGNORE_UNMATCHED_NETS ) {
                        strategy = IGNORE_INPUTS
                        init_flag = 1
                    } else strategy = FULL_MATCH
                    stuck = 0
```

```
              }
          case IGNORE_INPUTS
              if( stuck ) {
                  if( last_strategy == IGNORE_UNMATCHED_INSTANCES ) {
                      strategy = MATCH_ARBITRARY
                      init_flag = 1
                  } else strategy = FULL_MATCH
                  stuck = 0
              }
          case state MATCH_ARBITRARY
              strategy = FULL_MATCH /* end of the line */
      }
      last_strategy = strategy
  } while( !stuck )
  /* Done matching - now constraints may be issued on matched
        nets and instances*/
  return
}
/* Perform a single pass (re-hash -> hash cable entry -> matching)
      and return non-zero if unable to find any matches */
do_pass ( strategy , design0 , design1 , init_flag ) {
'/* change hash values to prevent possible collisions in hash
      table from blocking progress on successive passes. The
      argument 'init_flag' controls whether or not to reset the
      hash values for unmatched nets, instances.
  */
  /* Pick a new random number for each type of pin
        e.g. Xilinx 4K family: A, B, C, D, E, CLK, RES etc.
        Xilinx 8K family: I0, I1, I2, ci, co etc.
*/
rekey_all_cell_types()
/* re-initialize net hash values */
for_each_net_in ( design0 ) {
    if( net has a match ) {
        assign same random hash value to
        this net and its match in design1
    } else if( init_flag ) { set net hash value to 1}
}
for_each_net_in ( design1 )
    if( init_flag && net has no match ) { set net hash value to 1 }
}
/* re-initialize instance hash values */
for_each_instance_in ( design0 ) {
        if( instance has a match ) {
            assign same random hash value to this
            instance and its match in design1
        } else if( init_flag ) {
            set instance hash value to value selected
            previously for its cell type
        }
}
for_each_instance_in ( design1 ) {
    if( init_flag && instance has no match ) {
        set instance hash value to value selected
        previously for its cell type
    }
}
/* hash instances */
repeat for design0, design1 {
    for_each_instance_in ( design) {
        if( instance has no match ) {
            for_each_pin_on ( instance ) {
                if( ( strategy != IGNORE_INPUTS || pin->type is output )
                    && (strategy != IGNORE_UNMATCHED_NETS || pin->net is matched)) {
                    instance->hash_value +=   hash_value (instance)
                                              *hash_value (pin->type)
                                              *hash_value (pin->net)
                }
            }
        }
    }
}
/*hash nets */
repeat for design0, design1 {
   for_each_net_in (design) {
     if(net has no match) {
         for_each_pin_on ( net) {
            if( ( strategy != IGNORE_INPUTS || pin->type is output )
             &&( strategy != IGNORE_UNMATCHED_INSTANCES || pin ->instance is matched)) {
```

```
            net->hash_value += hash value(pin->instance) * hash_value( pin->type )
        }
      }
    }
  }
}
/* load hash table with instances
    The hash table is a list of bins which hold two count
    values and two pointers each:
            bin->count0
            bin->val0
            bin->count1
            bin->val1
    The hash table is conceptually an array of bins indexed
    by a (32-bit) hash value. Standard hash table techniques
    are used to keep the physical number of bins equal to
    the number of non-empty entries.
*/
clear_hash_table_bins()
for_each_instance_in ( design0 ) {
  if( instance has no match ) {
    bin = table [ hash_value( instance ) ]
    ++ bin->count0
    bin->val0 = instance
  }
}
for_each_instance_in ( design1) {
  if( instance has no match ) {
    bin = table [hash_value ( instance ) ]
    ++ bin->count1
    bin->val1 instance
  }
}
matched = 0
if ( strategy == MATCH_ARBITRARY ) {
  /* in trouble - try to match a pad by user-assigned port name */
  for_each_instance_in ( design0 ) {
    if ( instance is a pad
        && instance is unmatched
        && instance has a user-assigned port name
        && design1 has an unmatched pad with the same port name
        && these two instances have the same functionality ) {
      cross-reference the two instances as matched
      matched += 2
    }
  }
}
if ( strategy == MATCH_ARBITRARY && matched == 0) {
  /* in trouble - force a match between ambiguous interior instances */
  for_all_bins_in_hash_table (
    if ( bin->count0>1
        && bin->count1>1
        && bin->val0 is an interior instance
        && bin->val0 has the same functionality as bin->val1 ) {
      cross-reference the two instances as matched
      matched += 2
    }
  }
}
/* find uniquely matched instances */
for_all_bins_in_hash_table {
  if ( bin->count0 == 1 && bin->count1 == 1 ) {
    cross-reference the two instances as matched
    matched+=2
  }
}
/* load hash table with nets */
clear_hash_table_bins()
for_each_net_in (design0) {
  if(net has no match) {
    bin = table] hash_value ( net )]
    ++ bin->count0
    bin->val0 = net
  }
}
for_each_net_in ( design1 ) {
  if( net has no match ) {
    bin = table] hash_value( net ) ]
    ++ bin ->count1
    bin->val1 = net
```

-continued

```
      }
   }
}
for_all_bins_in_hash_table {
   if( bin->count0 == 1 && bin->count1 == 1)){
         cross-reference the two nets as matched
         matched += 2
      }
}
return( matched==0)
}
```

An Example Netlist Comparision

FIGS. 3 and 4 illustrate schematics of two circuit designs, the first design (tst1) representing an older design and the second design (tst2) representing a newer design. The following discussion sets forth the comparison between the first and second designs using the comparison process of the present invention.

In one embodiment, the netlist for the first design is stored and saved to a file. The netlist for the second design is then read in to the system and compared to the saved version of the first design. The results of the comparison process are set forth in more detail below. In the example below, the signatures are shown as 8-digit hex numbers.

During the first full pass, the signatures include all the information (component type, pin type, connectivity), and the hashing uses a full matching strategy. The signatures created are illustrated below:

|  | tst2: | tst1: | Comments: |
|---|---|---|---|
| Instances | AA = 84f913cc | U1 = 84f913cc | All NOR2 have the same signature |
|  | BB = 84f913cc | U2 = 84f913cc |  |
|  | CC = db650220 | U3 = db650220 | All INV1X have the same signature |
|  | DD = db650220 |  |  |
|  | EE = db650220 |  |  |
|  | FF = db650220 | U4 = db650220 |  |
|  | GG = db650220 | U5 = db650220 |  |
| Nets | CLK = 71559a6d | I = 71559a6d | Unique signature |
|  | D = 8c65d5a5 | A = 8c65d5a5 |  |
|  | E = 8c65d5a5 | B = 8c65d5a5 |  |
|  | F = 3fb3d5cd | C = 3fb3d5cd | Unique signature |
|  | G = 277c2d61 |  |  |
|  | H = 277c2d61 |  |  |
|  | NOT = f73cd97d | Q = f73cd97d |  |
|  | OUT = f73cd97d | QB = f73cd97d |  |
| Match nets: | CLK = I |  |  |
| Match nets: | F = C |  |  |

During the second pass using the full matching (full-match) strategy with recomputed signatures, the following results occur:

|  | tst2: | tst1: | Comments: |
|---|---|---|---|
| Instances | AA = 462a7b0e | U1 = 462a7b0e | Unique signature |
|  | BB = ac8f17d6 | U2 = ac8f17d6 | Unique signature |
|  | CC = ef4ed287 | U3 = ef4ed287 | Unique signature |
|  | DD = 68424b99 |  |  |
|  | EE = 68424b99 |  |  |
|  | FF = cc55b635 | U4 = a1da85d | Differences prevent match |
|  | GG = cc55b635 | U5 = a1da85d | Differences prevent match |
| Nets | D = 6cc71369 | A = dbbc6041 | Differences prevent match |
|  | E = 526e4df1 | B = c1639ac9 | Differences prevent match |
|  | G = dc381e40 |  |  |
|  | H = dc381e40 |  |  |
|  | NOT = c4f6e12c | Q = deaef614 | Differences prevent match |
|  | OUT = 841c0954 | QB = 9dd41e3c | Differences prevent match |
| Match instances: | AA = U1 |  |  |
| Match instances: | BB = U2 |  |  |
| Match instances: | CC = U3 |  |  |

In this case, those instances having unique signatures are stored in system memory and removed from further comparison.

During the third pass using the full matching strategy, no matches are made because of circuit differences. Therefore, a change of signature generation strategy is made on the next pass.

During the fourth pass, the ignore_nets strategy is used in which hash pins attached to unmatched nets are not hashed. The results of the signature comparson for the fourth pass are as follows:

|  | tst2: | tst1: | Comments: |
|---|---|---|---|
| Instances | DD = 3a574872 | | |
| | EE = 3a574872 | | |
| | FF = 3a574872 | U4 = 3a574672 | All INV1X look the same |
| | GG = 3a574872 | U5 = 3a574872 | |
| Nets | D = d507db39 | A = d507db39 | Unique signature |
| | E = a50b25db | B = a50b25db | Unique signature |
| | G = ae90d42b | | |
| | H = ae90d42b | | |
| | NOT = f359df49 | Q = f355df49 | Unique signature |
| | OUT = bbf38783 | QB = bbf38783 | Unique signature |
| Match net | D = A | | |
| Match net | E = B | | |
| Match net | NOT = Q | | |
| Match net | OUT = QB | | |

Note that four nets matched. Therefore, the strategy of ignoring all unmatched nets was helpful.

During the fifth pass, the ignore_nets strategy is again used. However, ignoring unmatched nets does not yield any more matches, so signature generation reverts to original strategy after this pass. Note that in an alternative embodiment, the signature generation may have continued with the use of a previously unused strategy instead of returning to the original full_match strategy. The results of the sixth pass are no more matches due to circuit differences.

During the seventh pass, the ignore_nets strategy is used. However, ignoring nets does not help this time, so the next pass will use a different strategy. During the eighth pass, the strategy is changed to ignore_instances. This does not result in any matches. During the ninth pass, the ignore_inputs strategy is used with the following results:

|  | tst2: | tst1: | Comments: |
|---|---|---|---|
| Instances | DD = 8c8a92b0 | | |
| | EE = 8c8a92b0 | | |
| | FF = aa500670 | U4 = aa500670 | Unique signature |
| | GG = ed6679f0 | U5 = ed667910 | Unique signature |
| Nets | G = f76fc841 | | |
| | H = f76fc841 | | |
| Match instance | FF = U4 | | |
| Match instance | GG = U5 | | |

As shown, two instances matched.

At this point, the matching process in complete—all nets and instances with possible matches have been matched. The added nets and instances in the second design (tst2) cannot be matched against anything. The net compare process reports the results and then generates placement constraints for the new design. The user can proceed directly to placement, or modify these constraints as desired. The following table summaries the constraints for the second design based on topological similarities to the first design. (CLCs refers to configurable logic cells.)

|  | Nets | CLCs | Pads | Misc |
|---|---|---|---|---|
| design | 8 | 7 | 0 | 0 |
| guide | 6 | 5 | 0 | 0 |
| correlation | 6 (85%) | 5 (83%) | 0 | 0 |

The following illustrate five guide constraints which constrain and provide attributes to the second design (tst2) information from the first design (tst1):

Issue constraint: constrain -quiet -instance 'AA' x14y$^3$
Issue constraint: constrain -quiet -instance 'BB' x16y$^4$
Issue constraint: constrain -quiet -instance 'CC' x14y$^4$
Issue constraint: constrain -quiet -instance 'FF' x16y$^3$
Issue constraint: constrain -quiet -instance 'GG' x13y$^3$ The Implementation Process Once all of the matching instances and nets between the old and new design have been identified, constraints are generated to control the implementation of the circuit from the second netlist. That is, in the present invention, if structures in the first and second netlists match, the physical implementation of that structure associated with the first netlist is used as the physical implementation of the matching structure in the physical implementation of the second netlist. The possible constraints that may be generated are dependent on the design tool being used and relate to how a subsequent netlist is physically implemented. These constraints may include partitioning, routing and placement constraints.

In one embodiment, in response to a match, the placement information for the earlier design is read out of storage (e.g., a database) and attributes of that design associated with the matching structure are copied into the stored implementation detail of the later design. In this manner, the matching structure has the same attributes. The attributes that are copied may include, but are not limited to, specifications of nets as being low skew, specification of elements that are to be implemented in dose proximity to a pad, etc.

The matching information may be used to guide mappings to ensure that logic is mapped into the same configurable logic block (CLB) of the newer design.

In one embodiment, the present invention is used twice in a guided design run. Initially, where the netlist comes from a synthesizer, matching information is used to control a partition phase. Partitioning is a process used during the implementation of designs for some field programmable gate arrays (EPGAs), whereby the logic elements in the original netlist are grouped together and assigned to specific logic processing blocks of the FPGA. In such a case, the partition of a new design would be based on the partitioning used in the earlier design. Once that has been completed, the partitioned netlist associated with the older design is compared with the partitioned netlist of the new design to control the placement of the partitioned function generators to the same locations.

In summary, the present invention performs a comparison to two nameless netlists and constrains the implementation of the later netlist based on the matching structures identified between the two.

Whereas many alterations and modifications of the present invention will no doubt become apparent to a person of ordinary skill in the art after having read the foregoing description, it is to be understood that the various embodiments shown and described by way of illustration are in no way to be considered limiting. Therefore, reference to the details of the various embodiments are not intended to limit the scope of the claims which themselves recite only those features regarded as essential to the invention.

I claim:

1. A method for performing circuit design comprising the steps of:
    comparing a first technology-dependent netlist corresponding to a first implementation to a second technology-dependent netlist to determine routing structures common to both netlists; and
    creating a second implementation constrained to include a portion of the first implementation associated with the common routing structures.

2. The method defined in claim 1 further comprising the steps of:
    synthesizing a first text description of a circuit design to obtain the first technology-dependent netlist;
    simulating the first implementation of the circuit design;
    altering the first text description to obtain a second text description; and
    synthesizing a second text description of the circuit design to obtain the second technology-dependent netlist.

3. The method defined in claim 2 wherein the step of simulating comprises simulating the first implementation of the circuit design on a programmable logic device.

4. The method defined in claim 1 wherein the step of creating comprises generating constraints to control the second implementation.

5. The method defined in claim 4 wherein the step of generating constraints comprises copying attributes of the first implementation for use in the second implementation.

6. The method defined in claim 1 wherein the step of comparing comprises comparing nets and instances in the first technology-dependent netlist to nets and instances in the second technology-dependent netlist.

7. The method defined in claim 6 wherein nets and instances in the first technology-dependent netlist and nets and instances in the second technology-dependent netlist are compared using signature analysis.

8. The method defined in claim 1 further comprising the step of assigning signatures for nets and instances in the first technology-dependent netlist and for nets and instances in the second technology-dependent netlist, and further wherein the step of comparing includes comparing signatures assigned for the first technology-dependent netlist to signatures assigned for the second technology-dependent netlist.

9. The method defined in claim 8 further comprising the step of placing nets and instances for the first technology-dependent netlist and the second technology-dependent netlist in a hash table and determining matches between the first and second technology-dependent netlist based on nets and instances of the first technology-dependent netlist and nets and instances of the second technology-dependent netlist resulting in a same hash table entry.

10. A method for performing circuit design comprising the steps of:
    generating a first technology-dependent netlist corresponding to a first implementation and a second technology-dependent netlist through logic synthesis;
    comparing the first technology-dependent netlist to the second technology-dependent netlist to determine common routing structures; and
    creating a second implementation constrained to include a portion of the first implementation associated with the common routing structures.

11. The method defined in claim 10 further comprising the steps of:
    synthesizing a first text description of a circuit design to obtain the first technology-dependent netlist;
    simulating the first implementation of the circuit design;
    altering the first text description to obtain a second text description; and
    synthesizing a second text description of the circuit design to obtain the second technology-dependent netlist.

12. The method defined in claim 10 wherein the step of creating comprises generating constraints to control the second implementation.

13. The method defined in claim 10 further comprising the step of computing signatures for nets and instances in the first technology-dependent netlist and for nets and instances in the second technology-dependent netlist, and further wherein the step of comparing includes comparing signatures computed for the first technology-dependent netlist to signatures computed for the second technology-dependent netlist.

14. The method defined in claim 13 further comprising the step of placing nets and instances for the first technology-dependent netlist and the second technology-dependent netlist in a hash table and determining matches and differences between the first and second technology-dependent netlist based on nets and instances of the first technology-dependent netlist and nets and instances of the second technology-dependent netlist resulting in a same hash table entry and different hash table entries respectively.

15. The method defined in claim 14 further comprising the step of recomputing signatures on successive passes.

16. The method defined in claim 15 further comprising the step of modifying signatures by ignoring unmatched instances when hashing nets.

17. The method defined in claim 15 further comprising the step of modifying signatures by ignoring unmatched nets when hashing instances.

18. The method defined in claim 15 further comprising the step of modifying signatures by ignoring input pins.

19. The method defined in claim 15 further comprising the step of modifying signatures by ignoring pin types.

20. The method defined in claim 15 further comprising the step of modifying signatures by ignoring component types.

21. The method defined in claim 13 further comprising the step of initially assigning all nets an identical signature and all instances of the same type identical signatures.

22. The method defined in claim 13 further comprising the step of recomputing signatures on successive passes to include all pins of the nets and instances.

23. The method defined in claim 12 wherein the step of generating constraints comprises copying attributes of the first implementation for use in the second implementation.

24. An apparatus that performs circuit design, said apparatus comprising:
   means for comparing a first technology-dependent netlist corresponding to a first implementation to a second technology-dependent netlist to determine one or more common routing structures, wherein the first technology-dependent netlist and the second technology-dependent netlist are derived as a result of logic synthesis; and
   means for generating a second implementation constrained to include a portion of the first implementation associated with the one or more common routing structures.

25. The apparatus defined in claim 24 further comprising a placement and routing means to implement the second implementation on a programmable logic device.

26. The apparatus defined in claim 24 further comprising means for computing signatures for nets and instances in the first technology-dependent netlist and nets and instances in the second technology-dependent netlist, wherein means for comparing determines said one or more common structures based on the signatures computed.

27. The apparatus defined in claim 26 wherein the means for comparing comprises a hash table, wherein the means for comparing uses the signatures to put nets and instances into the hash table, and further wherein identical signatures fall into the same hash table entry while different signatures from the first technology-dependent netlist are stored into hash table entries without corresponding entries in the second technology-dependent netlist.

28. The apparatus defined in claim 26 further comprising means for recomputing the signatures on successive passes.

29. The apparatus defined in claim 28 wherein the means for recomputing modifies signatures when no further matches are made during comparison.

30. The apparatus defined in claim 29 wherein the means for recomputing modifies signatures by ignoring unmatched instances when hashing nets.

31. The apparatus defined in claim 29 wherein the means for recomputing modifies signatures by ignoring unmatched nets when hashing instances.

32. The apparatus defined in claim 29 wherein the means for recomputing modifies signatures by ignoring input pins.

33. The apparatus defined in claim 29 wherein the means for recomputing modifies signatures by ignoring pin types.

34. The apparatus defined in claim 29 wherein the means for recomputing modifies signatures by ignoring component types.

35. The apparatus defined in claim 29 wherein the means for generating a second implementation comprises means for copying attributes of the first implementation for use in the second implementation.

36. A method for performing circuit design comprising the steps of:
   comparing a first technology-dependent netlist corresponding to a first placement of component instances to a second technology-dependent netlist to determine component instances common to both netlists; and
   creating a second placement of component instances constrained in placement by a portion of the first placement of component instances associated with the component instances common to both netlists.

* * * * *